(12) United States Patent
Reznicek et al.

(10) Patent No.: US 11,929,404 B2
(45) Date of Patent: Mar. 12, 2024

(54) TRANSISTOR GATES HAVING EMBEDDED METAL-INSULATOR-METAL CAPACITORS

(71) Applicant: International Business Machines Corporation, Armonk, NY (US)

(72) Inventors: Alexander Reznicek, Troy, NY (US); Takashi Ando, Eastchester, NY (US); Bahman Hekmatshoartabari, White Plains, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 17/463,992

(22) Filed: Sep. 1, 2021

(65) Prior Publication Data

US 2023/0065091 A1    Mar. 2, 2023

(51) Int. Cl.
| | |
|---|---|
| H01L 21/28 | (2006.01) |
| G06N 3/065 | (2023.01) |
| G11C 11/402 | (2006.01) |
| H10B 12/00 | (2023.01) |

(52) U.S. Cl.
CPC ........ *H01L 29/40114* (2019.08); *G06N 3/065* (2023.01); *G11C 11/4023* (2013.01); *H10B 12/30* (2023.02)

(58) Field of Classification Search
CPC .... H10B 12/30; G06N 3/065; G11C 11/4023; H01L 29/40114
See application file for complete search history.

(56) References Cited

U.S. PATENT DOCUMENTS

| | | | |
|---|---|---|---|
| 7,098,496 B2 | 8/2006 | Li et al. | |
| 10,128,249 B2 | 11/2018 | Akasawa et al. | |
| 10,833,102 B2 | 11/2020 | Teo et al. | |
| 2004/0042290 A1 | 3/2004 | Tarui et al. | |
| 2008/0230818 A1* | 9/2008 | Kumura | H10B 53/30 257/295 |
| 2019/0198617 A1 | 6/2019 | Li et al. | |

(Continued)

FOREIGN PATENT DOCUMENTS

| | | |
|---|---|---|
| EP | 1143525 A2 | 10/2001 |
| EP | 3979321 A1 | 4/2022 |

(Continued)

OTHER PUBLICATIONS

V. Milo et al., "Memristive and CMOS Devices for Neuromorphic Computing," Materials, vol. 13, No. 166, 2020, 33 pages.

(Continued)

*Primary Examiner* — Nicholas J Tobergte
*Assistant Examiner* — Kevin Quinto
(74) *Attorney, Agent, or Firm* — Samuel Waldbaum; Ryan, Mason & Lewis, LLP

(57) ABSTRACT

A semiconductor structure comprises a gate structure of a transistor. The gate structure comprises a gate conductive portion disposed on a gate dielectric layer. The semiconductor structure further comprises a capacitor structure disposed on the gate structure. The capacitor structure comprises a first conductive layer, a dielectric layer disposed on the first conductive layer and a second conductive layer disposed on the dielectric layer. The first and second conductive layers are respectively connected to a first contact portion and a second contact portion.

20 Claims, 12 Drawing Sheets

(56) References Cited

U.S. PATENT DOCUMENTS

2020/0350322 A1  11/2020  Liu et al.
2021/0020774 A1  1/2021  Yu et al.
2022/0102558 A1  3/2022  Yamaguchi

FOREIGN PATENT DOCUMENTS

WO  2019022860 A1  1/2019
WO  PCT/EP2022/074000  1/2023

OTHER PUBLICATIONS

M. Popovici et al., "High-Performance (EOT<0.4nm, Jg~10-7 A/cm2) ALD-Deposited Ru/SrTiO3 Stack for Next-Generations DRAM Pillar Capacitor," 2018 IEEE International Electron Devices Meeting, 2018, 4 pages.

S. Ambrogio et al., "Equivalent-Accuracy Accelerated Neural-Network Training Using Analogue Memory," Nature, vol. 558, Jun. 7, 2018, 23 pages.

\* cited by examiner

TRANSISTOR GATES HAVING EMBEDDED METAL-INSULATOR-METAL CAPACITORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the disclosure include a semiconductor structure having a metal-insulator-metal (MIM) capacitor on a gate of a transistor and techniques for forming the semiconductor structure.

In an exemplary embodiment, a semiconductor structure comprises a gate structure of a transistor. The gate structure comprises a gate conductive portion on a gate dielectric layer. The semiconductor structure further comprises a capacitor structure on the gate structure. The capacitor structure comprises a first conductive layer, a dielectric layer on the first conductive layer and a second conductive layer on the dielectric layer. The first and second conductive layers are respectively connected to a first contact portion and a second contact portion.

In another embodiment, a neuromorphic computing device comprises an array of memory cells. At least one of the memory cells comprises a transistor comprising a gate structure, and a capacitor connected to the gate structure. The capacitor comprises a first conductive layer on top of the gate structure, a second conductive layer on the first conductive layer, and a dielectric layer between the first conductive layer and the second conductive layer. The first and second conductive layers are respectively connected to a first contact and a second contact.

In another embodiment, a method of forming semiconductor structure comprises forming a gate dielectric layer, and forming a gate conductive portion on the gate dielectric layer. The gate dielectric layer and the gate conductive portion form part of a field-effect transistor. In the method, a first conductive layer is formed on top of the gate conductive portion, a dielectric layer is formed on the first conductive layer, and a second conductive layer is formed on the dielectric layer. The first and second conductive layers and the dielectric layer form a metal-insulator-metal capacitor. The method further comprises forming a first contact portion connected to the first conductive layer, and forming a second contact portion connected to the second conductive layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
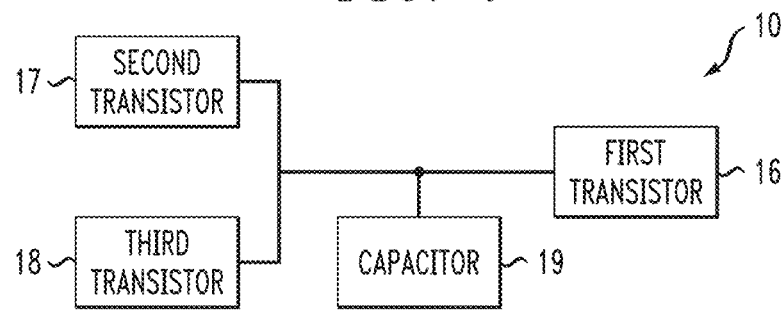
FIG. 1 shows a block diagram of a memory circuit, according to an embodiment of the invention.

Exemplary embodiments of the invention will now be discussed in further detail with regard to semiconductors and techniques for forming semiconductor structures, in particular, semiconductor structures having a MIM capacitor on a gate of a transistor.

It is to be understood that the various features as shown in the accompanying drawings are schematic illustrations that are not drawn to scale. In addition, for ease of illustration and explanation, one or more layers, structures, regions, features, etc., of a type commonly used to implement a MIM capacitor, field-effect transistor (FET), complementary metal-oxide-semiconductor (CMOS), fin field-effect transistor (FinFET), nanowire FET, nanosheet FET, metal-oxide-semiconductor field-effect transistor (MOSFET), resistive memory device and/or other devices or structures and system components as schematically shown in the drawings, may not be explicitly shown in a given drawing. This does not imply that any layers, structures, regions, features, etc., not explicitly shown are omitted from the actual devices or structure. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs. The word "over" as used herein to describe the orientation of a given feature with respect to another feature means that the given feature may be disposed or formed "directly on" (i.e., in direct contact with) the other feature, or that the given feature may be disposed or formed "indirectly on" the other feature with one or more intermediate features disposed between the given feature and the other feature.

This disclosure relates generally to non-volatile analog resistive memory cells for neuromorphic computing, and techniques for forming semiconductor structures of non-volatile analog resistive memory cells. Information processing systems such as neuromorphic computing systems and artificial neural network (ANN) systems are utilized in various applications such as machine learning and inference processing for cognitive recognition and computing. Such systems are hardware-based systems that generally include a large number of highly interconnected processing elements (referred to as "artificial neurons") that operate in parallel to perform various types of computations. The artificial neurons (e.g., pre-synaptic neurons and post-synaptic neurons) are connected using artificial synaptic devices which provide synaptic weights that represent connection strengths between the artificial neurons. The synaptic weights can be implemented using analog memory elements, such as tunable resistive memory devices, which exhibit non-volatile and multi-level memory characteristics.

In general, neuromorphic computing utilizes very-large-scale integration (VLSI) systems containing analog circuits to mimic neuro-biological architectures present in the nervous system. For example, arrays of trainable resistive devices, referred to as resistive processing units (RPUs), can be used to form ANNs, which perform machine learning to learn and implement algorithms.

RPU architecture includes a plurality of non-volatile resistive elements, such as phase change devices, each in series with a FET connected in a diode configuration, that change their states after application of a certain voltage. For example, RPU devices are implemented with resistive random access memory (RRAM), phase change memory (PCM), programmable metallization cell (PMC) memory, non-linear memristive systems, or any other two-terminal devices that have non-linear resistive switching characteristics, and which have a tunable conductance (G) with variable conductance states over a range from a min conductance (Gmin) to a maximum conductance (Gmax). As noted above, neuromorphic computing systems and ANN systems are types of in-memory computing systems in which artificial neurons are connected using artificial synaptic devices to provide synaptic weights which represent the strength of connection between two artificial neurons. The synaptic weights can be implemented using tunable resistive memory devices, wherein the variable conductance states are used to represent the synaptic weights and to perform computations (e.g., vector-matrix multiplication). The conductance states of the analog resistive memory devices are encoded or otherwise mapped to synaptic weights.

Various types of artificial neural networks, such as deep neural networks (DNNs) and convolutional neural networks (CNNs) implement neuromorphic computing architectures for machine learning applications such as image recognition, object recognition, speech recognition, etc. The in-memory computations associated with such neural networks include, e.g., training computations in which the synaptic weights of the resistive memory cells are optimized by processing a training dataset, and forward inference computations in which the trained neural networks are used to process input data for purposes of, e.g., classifying the input data, predicting events based on the input data, etc.

DNN training generally relies on a backpropagation algorithm which includes three repeating cycles: forward, backward and weight update, which are repeated many times until a convergence criterion is met. The forward and backward cycles mainly involve computing vector-matrix multiplication in forward and backward directions. This operation can be performed on a 2D array of analog resistive memory cells. In a forward cycle, stored conductance values of the resistive memory devices in the 2D array form a matrix, and an input vector is transmitted as voltage pulses through each input rows of the 2D array. In a backward cycle, voltage pulses are supplied from columns as an input, and a vector-matrix product is computed on the transpose of a matrix. The weight update involves calculating a vector-vector outer product which consists of a multiplication operation and an incremental weight update to be performed locally in each resistive memory cell within the 2D array.

A stochastically trained DNN comprising arrays of RPU cells can have synaptic weights implemented using tunable resistive memory devices. To properly train a DNN and achieve high-accuracy, the operating characteristics of the tunable resistive devices should meet a stringent set of specifications of acceptable RPU device parameters that a given DNN algorithm can tolerate without significant error penalty. These specifications include, for example, variations in the switching characteristics of the resistive memory device, such as, minimum incremental conductance change ($\pm \Delta g_{min}$) due to a single potentiation pulse, symmetry in up and down conductance changes, tunable range of the conductance values, etc.

In particular, one important specification for DNN training is that the RPU cells should have a tunable conductance with a resolution (or dynamic range) of at least 1000 conductance levels (or steps), wherein the conductance levels can be switched (via 1-ns pulses) from a lowest conductance state to a highest conductance state in an analog and symmetrically incremental manner (with at least one order of magnitude of conductance difference between the maximum and minimum conductance state (on/off ratio)). To achieve symmetry of up/down changes of a minimum unit weight value ($\pm \Delta w_{min}$) in an RPU cell, each incremental increase (step up, $\Delta g_{min}^+$) and incremental decrease (step down, $\Delta g_{min}^-$) in the associated conductance level of the RPU cell should be the same amount or a similar amount within no more than 5% mismatch error. In other words, tunable resistive RPU devices, which are analog in nature, should respond symmetrically in up and down conductance changes when provided the same but opposite pulse stimulus. In particular, the Up/Down symmetry, $$\frac{\Delta g_{min}^+}{\Delta g_{min}^-},$$

should be equal to 1.0±0.05. It is to be noted that the parameter $\Delta g_{min}^\pm$ is proportional to the parameter $\Delta w_{min}^\pm$ through an amplification factor defined by the peripheral circuitry. However, tunable resistive devices such as memristive devices (or memristors) typically exhibit variability in tuning/programming characteristics, making it difficult to achieve symmetric weight updates over the range (min-max) of conductance levels.

Up/Down symmetry is desirable for analog memory. However, it is difficult to obtain required specifications when using existing PCM and filamentary RRAM as the synaptic devices. Specifically, PCM elements are capable of being partially set, but exhibit abrupt reset characteristics, while filamentary RRAM elements exhibit gradual reset, but abrupt set characteristics.

As explained in further detail below, exemplary embodiments provide structures that compensate for such non-ideal switching behaviors. The embodiments provide a semiconductor structure including a volatile capacitor connected to a transistor gate, which minimizes a device footprint by forming the capacitor on a transistor gate so that the capacitor and the transistor fit in a footprint of one transistor. In one or more embodiments, the capacitor comprises a MIM capacitor embedded in a gate of MOSFET. The MIM capacitor has separate paths to respective contacts for bottom and top electrodes of the MIM capacitor, and the respective bottom and top electrodes comprise different metals. In a manufacturing method of the semiconductor structure, the bottom electrode is selectively recessed to form a self-aligned contact cap layer.

In an illustrative embodiment, the semiconductor structure, including the capacitor on the transistor gate, comprises a portion of a 3T1C (three transistor, one capacitor) circuit of an analog memory unit cell in an array of analog resistive memory cells. The transistor gate corresponds to one of the three transistors of the 3T1C circuit and the capacitor corresponds to the one capacitor of the 3T1C circuit. The 3T1C circuit combines long-term storage of weights in PCM devices with near-term updates of volatile capacitors. The near-term weight updates are performed via the 3T1C circuit.

FIG. 1 shows a block diagram of a memory circuit 10 of a neuromorphic computing device. The memory circuit 10 may comprise one of a plurality of analog memory unit cells in an array of analog resistive memory cells of a neuromorphic computing device. The memory circuit 10 comprises a first transistor 16, a second transistor 17, a third transistor 18 and a capacitor 19 to form a 3T1C circuit as noted herein. The transistors 16, 17 and 18 of the memory circuit 10 may comprise, for example, respective planar FETs, respective FinFETs, respective nanosheet devices, or combinations of planar FETs, FinFETs and nanosheet devices or any other FET design (e.g., vertical transport FETs (VTFETs), nanowire devices, 2D-material FETs, graphene FETs, etc., as long as the FET design has a gate). The capacitor 19 comprises, for example, a MIM capacitor.

FETs are widely used for switching, amplification, filtering, and other tasks. FETs include MOSFETs. CMOS devices are widely used, where both n-type and p-type transistors (NFET and PFET) are used to fabricate logic and other circuitry. Source and drain regions of a FET (also referred to herein as a "planar FET") are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

FinFET devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction.

Nanosheet devices can be viable device options instead of FinFETs. In general, a nanosheet FET device comprises a device channel which comprises one or more nanosheet layers in a stacked configuration, wherein each nanosheet layer has a vertical thickness that is substantially less than the width of the nanosheet layer. A common gate structure is formed above and below each nanosheet layer in a stacked configuration, thereby increasing the FET device width (or channel width), and thus the drive current, for a given footprint area. Nanosheets can be used as the fin structure in a dual-gate, tri-gate or gate-all-around (GAA) FET device. Nanosheet formation relies on the selective removal of one semiconductor (e.g., Si) with respect to another (e.g., SiGe) to form the nanosheet and GAA structures.

Figure 2A:
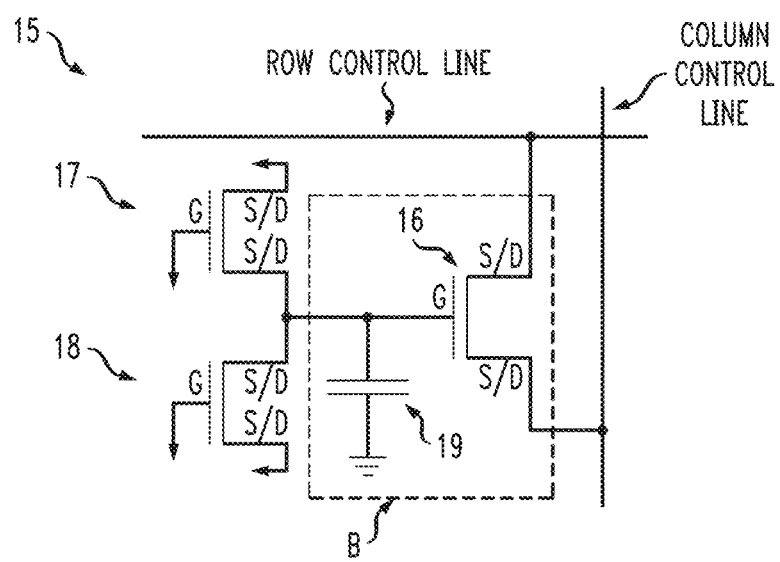
FIG. 2A shows a circuit diagram of the memory circuit of FIG. 1, according to an embodiment of the invention.
Figure 2B:
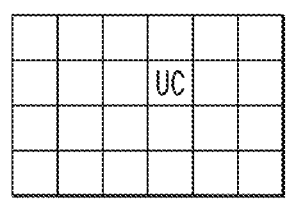
FIG. 2B illustrates an array of analog resistive memory unit cells of a neuromorphic computing device, according to an embodiment of the invention.

FIG. 2A shows a circuit diagram of a memory circuit 15 of a neuromorphic computing device, and FIG. 2B illustrates an array 20 of analog resistive memory unit cells (UC) (also referred to herein as "unit cells") of a neuromorphic computing device. The memory circuit 15 may comprise at least a portion of one of the plurality of analog memory unit cells (UC) in the array 20. The circuit 15 depicts the first transistor 16, the second transistor 17, the third transistor 18 and the capacitor 19 forming the 3T1C circuit. As shown in FIG. 2A, the capacitor 19 is connected to a gate (G) of the transistor 16, and to source/drain regions (S/D) of the transistors 17 and 18. The source/drain regions (S/D) of the transistor 16 are respectively connected to a row control line and to a column control line, which respectively control signals in the same row and same column of the array 20 of analog resistive memory unit cells (UC). In one or more embodiments, a unit cell (UC) of the array 20 may be a standard unit cell or a shared unit cell. The 3T1C circuit comprising the first transistor 16, the second transistor 17, the third transistor 18 and the capacitor 19 may be a part of a standard unit cell of the array 20 of analog resistive memory unit cells and/or comprise a shared unit cell of the array 20 of analog resistive memory unit cells. According to an embodiment, each standard unit cell comprises a higher-significance pair of PCM devices and a 3T1C circuit comprising a volatile analogue conductance. Each shared unit cell contains a 3T1C circuit comprising the other volatile analogue conductance that completes a lower-significance conductance pair.

The transistor 16 and the capacitor 19 in the dotted box B in FIG. 2A represent a transistor and a capacitor having the gate and capacitor structures of the semiconductor device 100 in FIGS. 3-13. In a non-limiting operational example, a 10 fF capacitance can fit into a 14 nm extended-gate field-effect transistor (EGFET) with 15 fins when using the gate and capacitor semiconductor structure of the embodiments.

Figure 3:
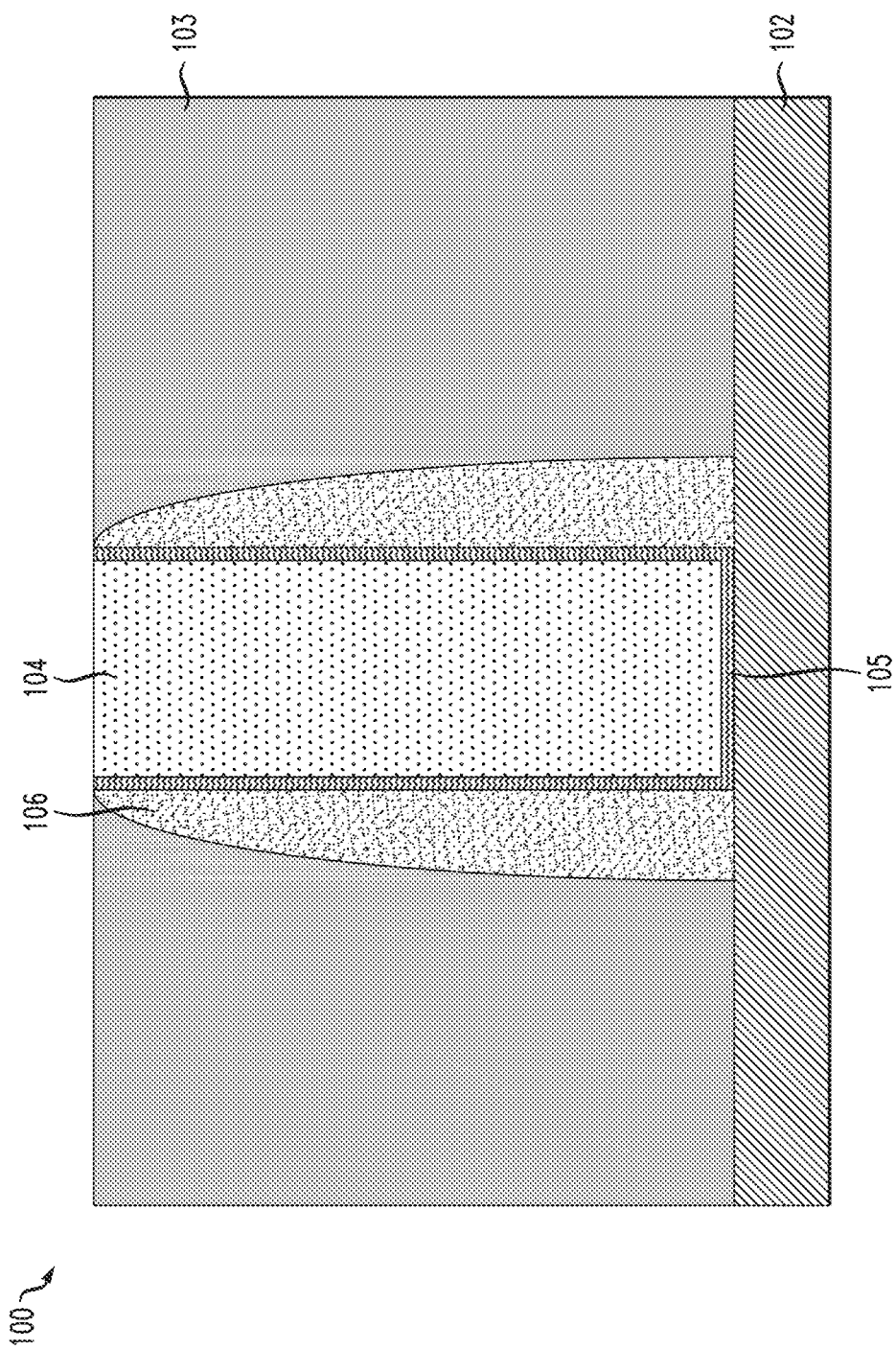
FIG. 3 shows a cross-sectional view of a semiconductor device comprising a gate structure, according to an embodiment of the invention.

Referring to FIG. 3, a cross-sectional view of a gate structure comprising a gate dielectric layer 105 and a gate conductive portion 104 is formed on semiconductor substrate 102. Dielectric spacers 106 are formed on left and right sides of the gate structure. The semiconductor substrate 102 includes semiconductor material including, but not limited to, silicon (Si), silicon germanium (SiGe), Si:C (carbon doped silicon), carbon doped silicon germanium (SiGe:C), III-V compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried silicon oxide, silicon nitride layer or aluminum oxide.

According to an embodiment, the gate structure comprising the gate dielectric layer 105 and the gate conductive portion 104 corresponds to a planar FET, in which case, the semiconductor substrate 102 and/or intervening layers between the substrate 102 and the gate structure include a configuration and necessary elements for a planar FET, such as for example, a channel region (not shown) under the gate dielectric layer 105, source/drain regions (not shown) on either side of the channel region and under the spacers 106 and isolation regions (e.g., shallow trench isolation (STI) regions) (not shown) adjacent the source/drain regions. Alternatively, the gate structure may correspond to a FinFET, in which case, the semiconductor substrate 102 and/or intervening layers between the substrate 102 and the gate structure may include a configuration and necessary elements for a FinFET such as for example, a raised channel region (fin) around which the gate structure is formed and source/drain regions on lateral sides of the fins. In another alternative, the gate structure may correspond to a nanosheet device, in which case, the semiconductor substrate 102 and/or intervening layers between the substrate 102 and the gate structure may include a configuration and necessary elements for a nanosheet device such as for example, nanosheet layers in a stacked configuration, where the gate structures are formed above and below each nanosheet layer in the stacked configuration.

In accordance with an embodiment of the present invention, the gate dielectric layer 105 is formed in a U-shape around the left, right and bottom surfaces of the gate conductive portion 104. The gate dielectric layer 105 is formed between the gate conductive portion 104 and a channel portion of the transistor to which the gate structure corresponds. For example, in the case of a planar transistor, the gate dielectric layer 105 is formed between a bottom surface of the gate conductive portion 104 and a top surface of the channel region. The gate dielectric layer 105 includes, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate conductive portion 104 includes a work-function metal (WFM) layer, including but not necessarily limited to, for a p-type FET (PFET), titanium nitride (TiN), tantalum nitride (TaN) or ruthenium (Ru), and for an n-type FET (NFET), TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer 105. The gate conductive portion 104 can further include a gate layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer 105. Alternatively, the gate conductive portion 104 includes one of the WFM layer and the gate layer.

In one or more embodiments of the invention, the layers for the gate dielectric layer 105 and gate conductive portion 104 can be deposited using, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by one or more planarization processes, such as, chemical mechanical planarization (CMP).

The spacers 106 are formed on the substrate 102 adjacent to the gate structure, to be in direct contact with opposing sidewalls of the gate structure, in this case in direct contact with the gate dielectric layer 105, which is formed in a U-shape around the exterior of the gate conductive portion 104. Alternatively, the gate dielectric layer 105 may be on the bottom surface of the gate conductive portion 104 and not on sides of the gate conductive portion 104, in which case, the spacers 106 would be in direct contact with the gate conductive portion 104. The spacers 106 can include a dielectric insulating material such as, for example, silicon nitride (SiN), silicon oxynitride (SiON), carbon doped silicon oxynitride (SiOCN), boron nitride (BN), silicon boron nitride (SiBN), silicon boron carbon nitride (SiBCN) or multilayered stacks thereof.

An inter-layer dielectric (ILD) layer 103, including, but not necessarily limited to, silicon dioxide ($SiO_2$), low-temperature oxide (LTO), high-temperature oxide (HTO), flowable oxide (FOX) or some other dielectric is deposited on the substrate 102 to fill in areas adjacent the gate structure including the spacers 106 thereon. The ILD layer 103 can be deposited using, for example, CVD, PECVD, RFCVD, PVD, ALD, MLD, MBD, PLD, LSMCD, and/or sputtering, followed by planarization by, for example, CMP. According to an embodiment, the ILD layer 103 comprises a different material (e.g., oxide) from the spacers (e.g., nitride) so that the spacers 106 and/or the ILD layer 103 can be selectively etched with respect to each other, as described further herein.

Figure 4:
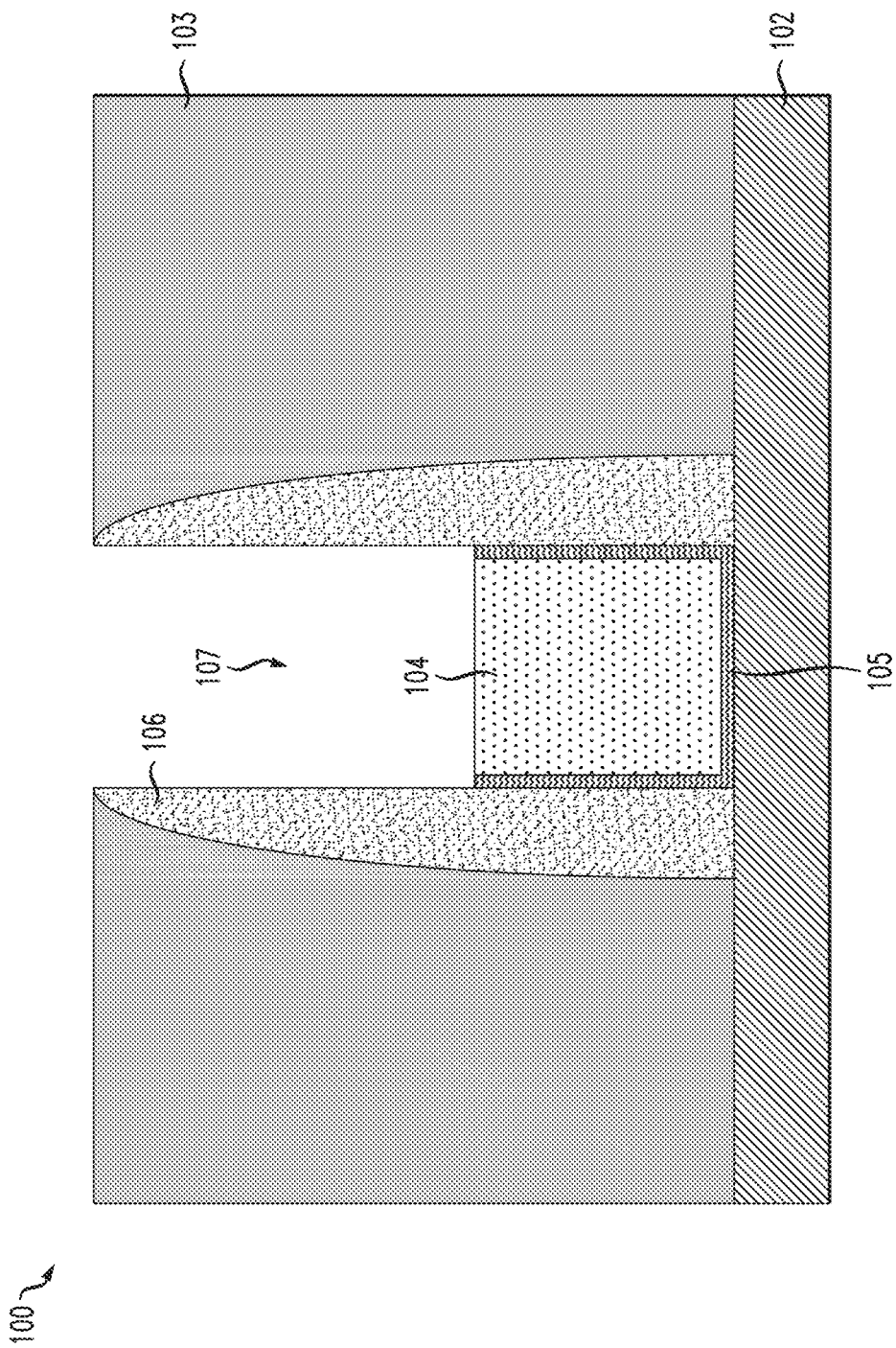
FIG. 4 shows a cross-sectional view of the FIG. 3 structure following recessing of the gate structure, according to an embodiment of the present invention.

Referring to FIG. 4, the gate structure including the gate conductive portion 104 and the gate dielectric layer 105, is recessed to a lower height below the top surfaces of the spacers 106 and ILD layer 103 to create a vacant area 107 above the gate structure. The embodiments use wet or dry etch processes to etch the gate conductive portion 104. Such wet or dry etch processes include, for example, SC1, $H_2O_2$, citric acid, etc., at certain optimized ratios and temperatures. The portions of the gate dielectric layer 105 exposed after recessing of the gate conductive portion 104 are removed using, for example, wet HF:HCl etch.

Figure 5:
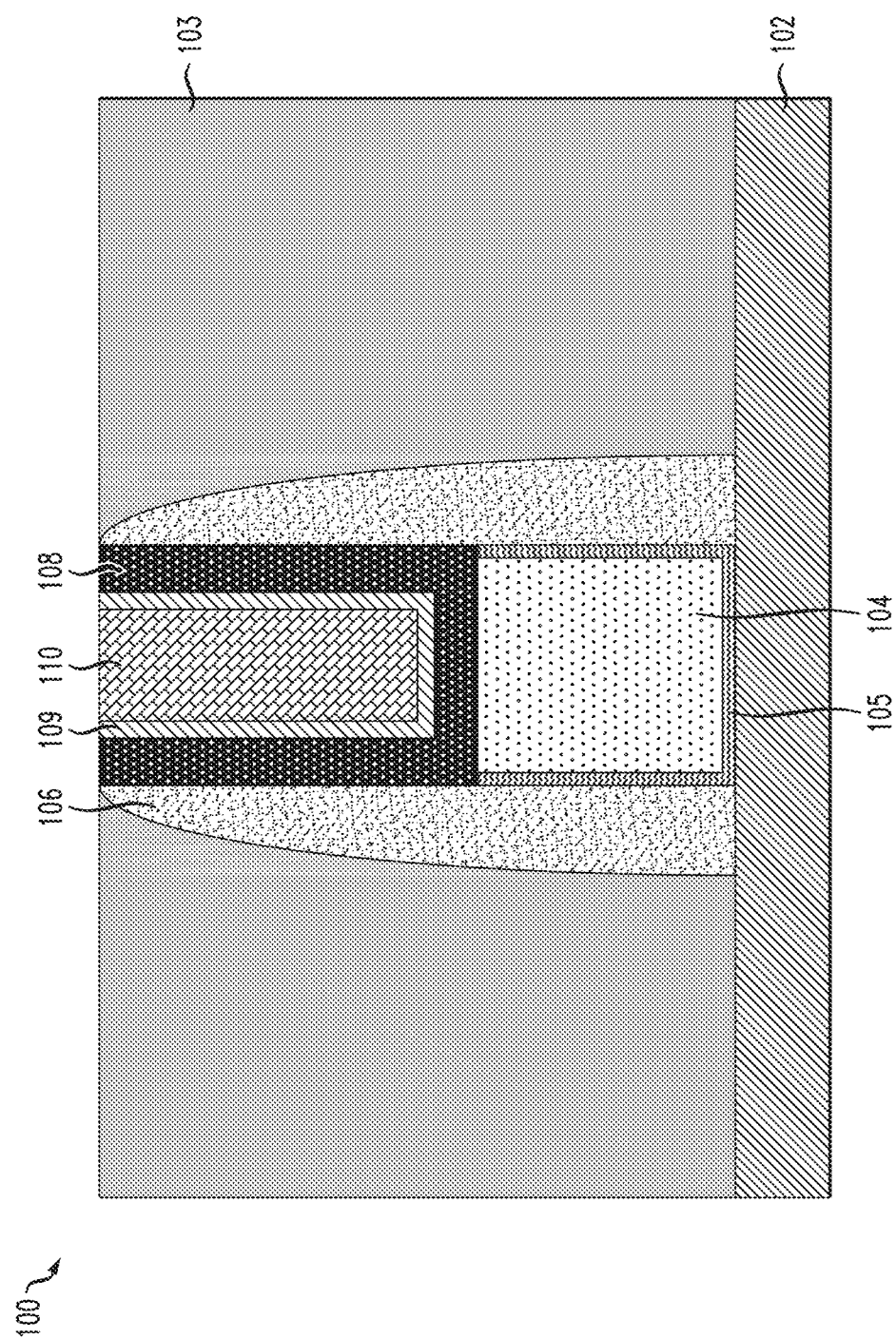
FIG. 5 shows a cross-sectional view of the FIG. 4 structure following deposition of a MIM capacitor structure on the recessed gate structure, according to an embodiment of the present invention.

Referring to FIG. 5, a MIM capacitor structure is deposited in the vacant area 107 between the spacers 106 on the recessed gate structure. According to a non-limiting embodiment, a first (e.g., lower) conductive layer 108 of the capacitor structure comprises TiN and is in a U-shape, being formed on lateral sides of the exposed portions of the spacers 106, and on the exposed top surfaces of gate dielectric layer 105 and the gate conductive portion 104. A thickness of the first conductive layer 108 is about 3 nm to about 10 nm, and can be dependent on the overall available space at a top of the gate structure. Alternative materials for the first conductive layer 108 may comprise, but are not necessarily limited to, tungsten (W), cobalt (Co), or any other gate stack compatible metal with etch selectivity to the second conductive layer of the capacitor structure.

A dielectric layer 109 of the capacitor structure comprises a high-K material such as, for example, one of the high-K materials listed in connection with the material of the gate dielectric layer 105. The dielectric layer is also in a U-shape, being formed on the U-shaped first conductive layer 108. A second (e.g., upper) conductive layer 110 of the capacitor structure is deposited on the dielectric layer 109 in a remaining portion of the vacant area 107. A material of the second conductive layer 110 is different from a material of the first conductive layer 108 so that the first and second conductive layers 108 and 110 can be selectively etched with respect to each other. For example, if the first conductive layer 108 comprises TiN, the second conductive layer comprises, for example, W or TaN. Alternatively, if the first conductive layer 108 comprises W or TaN, the second conductive layer comprises, for example, TiN. A lateral width (e.g., left-right in FIG. 5) of the capacitor structure including first and second conductive layers 108 and 110 and the dielectric layer 109 (as well as a corresponding lateral width of the gate structure) is in the range of about 20 nm to about 100 nm.

The first and second conductive layers 108 and 110 and the dielectric layer 109 are deposited using, for example, deposition techniques including, but not limited to, CVD, PECVD, RFCVD, PVD, ALD, MLD, MBD, PLD, LSMCD, sputtering, and/or plating.

Figure 6:
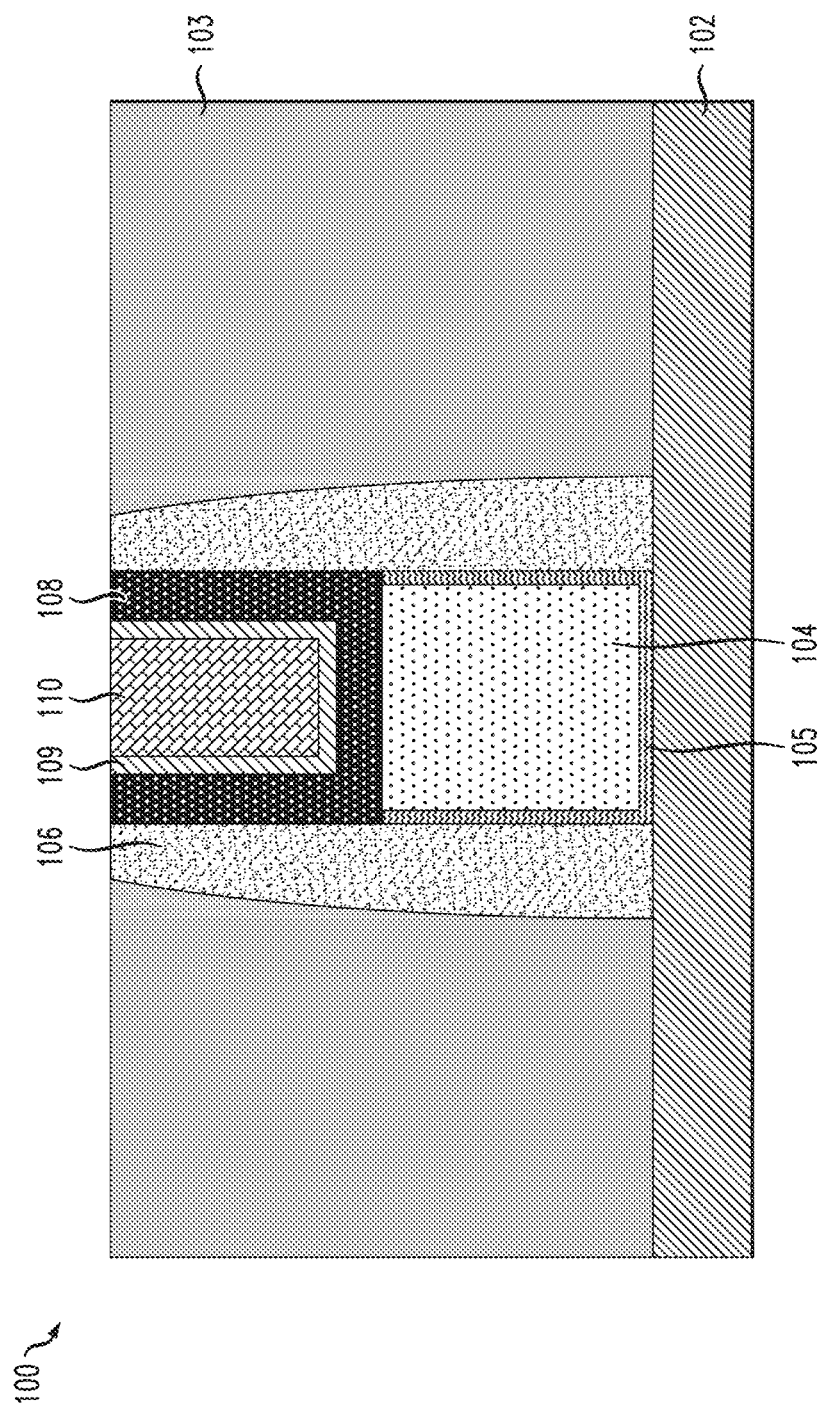
FIG. 6 shows a cross-sectional view of the FIG. 5 structure following planarization, according to an embodiment of the present invention.

Referring to FIG. 6, the deposition of the layers 108, 109 and 110 of the capacitor structure is followed by a planarization process, such as, for example, CMP. As can be seen in a comparison of FIG. 5 and FIG. 6, the planarization process is performed down to a height where the spacers 106 have a greater lateral width (e.g., left-right width in FIGS. 5 and 6). As can be seen in FIG. 5, the lateral width of the spacers 106 increases with the decreasing vertical height of the spacers 106.

Figure 7:
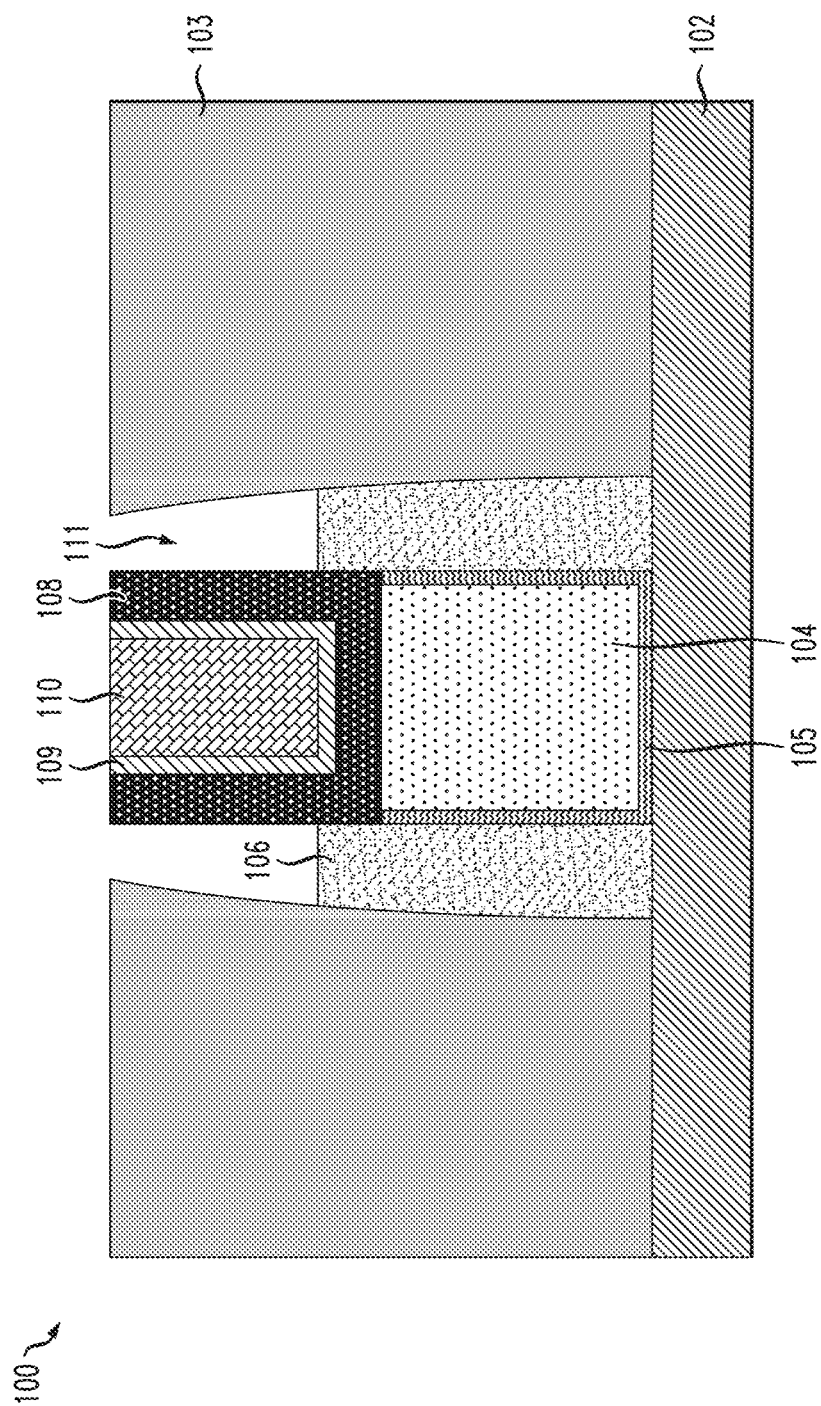
FIG. 7 shows a cross-sectional view of the FIG. 6 structure following recessing of spacers, according to an embodiment of the present invention.

Referring to FIG. 7, the spacers 106 are recessed to a lower vertical height, such that top surfaces of the spacers 106 are near a lower portion of the capacitor structure and an upper portion of the gate structure. The recessing of the spacers 106 creates vacant areas 111 between the portions of the first conductive layer 108 and portions of the ILD layer 103. The recessing of the spacers 106 is performed by selectively etching the spacers 106 with respect to materials of the ILD layer 103, and the materials of the first and second conductive and dielectric layers 108, 109 and 110 of the capacitor structure. For example, if the spacers 106 comprise a nitride, the spacers 106 are selectively etched with respect to the ILD layer 103 comprising an oxide, and with respect to metal and high-K materials of the layers 108, 109 and 110. The selective etching of the spacers 106 can be performed using, for example, hot phosphoric acid.

Figure 8:
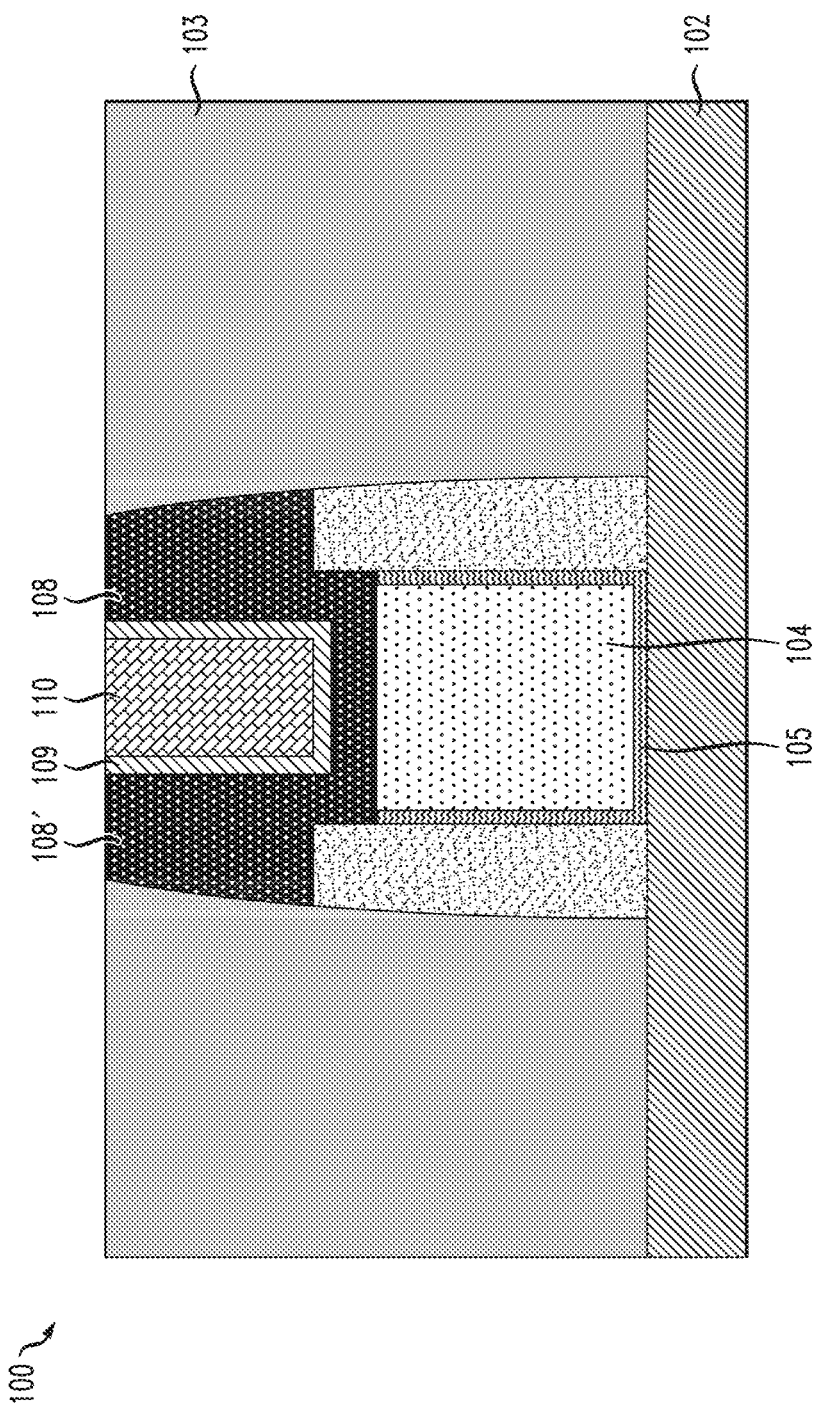
FIG. 8 shows a cross-sectional view of the FIG. 7 structure following deposition of metal on the recessed spacers and planarization, according to an embodiment of the present invention.

Referring to FIG. 8, conductive layers 108' are deposited on the recessed spacers 106 to fill in the vacant areas 111 between the portions of the first conductive layer 108 and portions of the ILD layer 103. As shown by the same pattern and similar numbering, in an embodiment, the conductive layers 108' comprise the same material as the first conductive layer 108 and functions to extend the conductive layer 108. Alternatively, the conductive layers 108' comprise another conductive material, such as another conductive metal that can be etched similarly to the conductive layer 108 and selectively with respect to the second conductive layer 110. The conductive layers 108' are deposited using, for example, CVD, PECVD, RFCVD, PVD, ALD, MLD, MBD, PLD, LSMCD, and/or sputtering, followed by planarization by, for example, CMP to remove excess portions of the conductive layer 108' from on top of the ILD layer 103, first conductive layer 108, dielectric layer 109 and/or second conductive layer 110.

Figure 9:
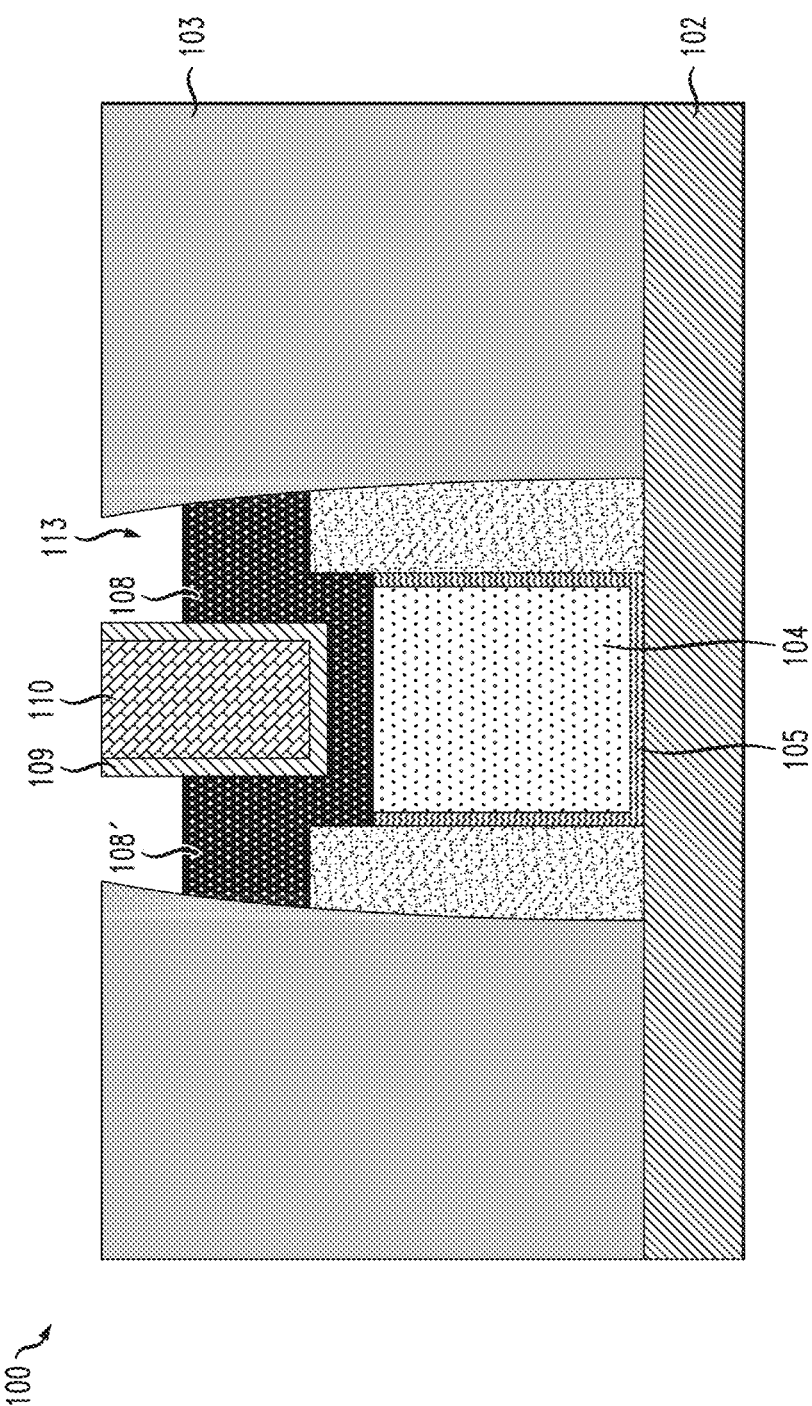
FIG. 9 shows a cross-sectional view of the FIG. 8 structure following selective recessing of a bottom metal of the MIM capacitor structure, according to an embodiment of the present invention.

Referring to FIG. 9, the conductive layers 108 and 108' having the same material as each other are recessed to a lower vertical height, such that top surfaces of the conductive layers 108 and 108' are below top surfaces of the remaining layers 109 and 110 of the capacitor structure. The recessing of the conductive portions 108 and 108' creates vacant areas 113 between portions of the dielectric layer 109 and portions of the ILD layer 103. The recessing of the conductive layers 108 and 108' is performed by selectively etching the conductive layers 108 and 108' with respect to materials of the ILD layer 103, and the materials of the second conductive and dielectric layers 109 and 110 of the capacitor structure. For example, if the conductive layers 108 and 108' comprise TiN, the conductive layers 108 and 108' are selectively etched with respect to the second conductive layer 110 comprising W or TaN, and with respect to the dielectric materials of the ILD and dielectric layers 103 and 109. The selective etching of the conductive layers 108 and 108' can be performed using, for example, a dry nitrogen-trifluoride ($NF_3$) plasma etch process performed at approximately 250 degrees C., resulting in approximately a 0.4:1 (W:TiN) etch rate.

Figure 10:
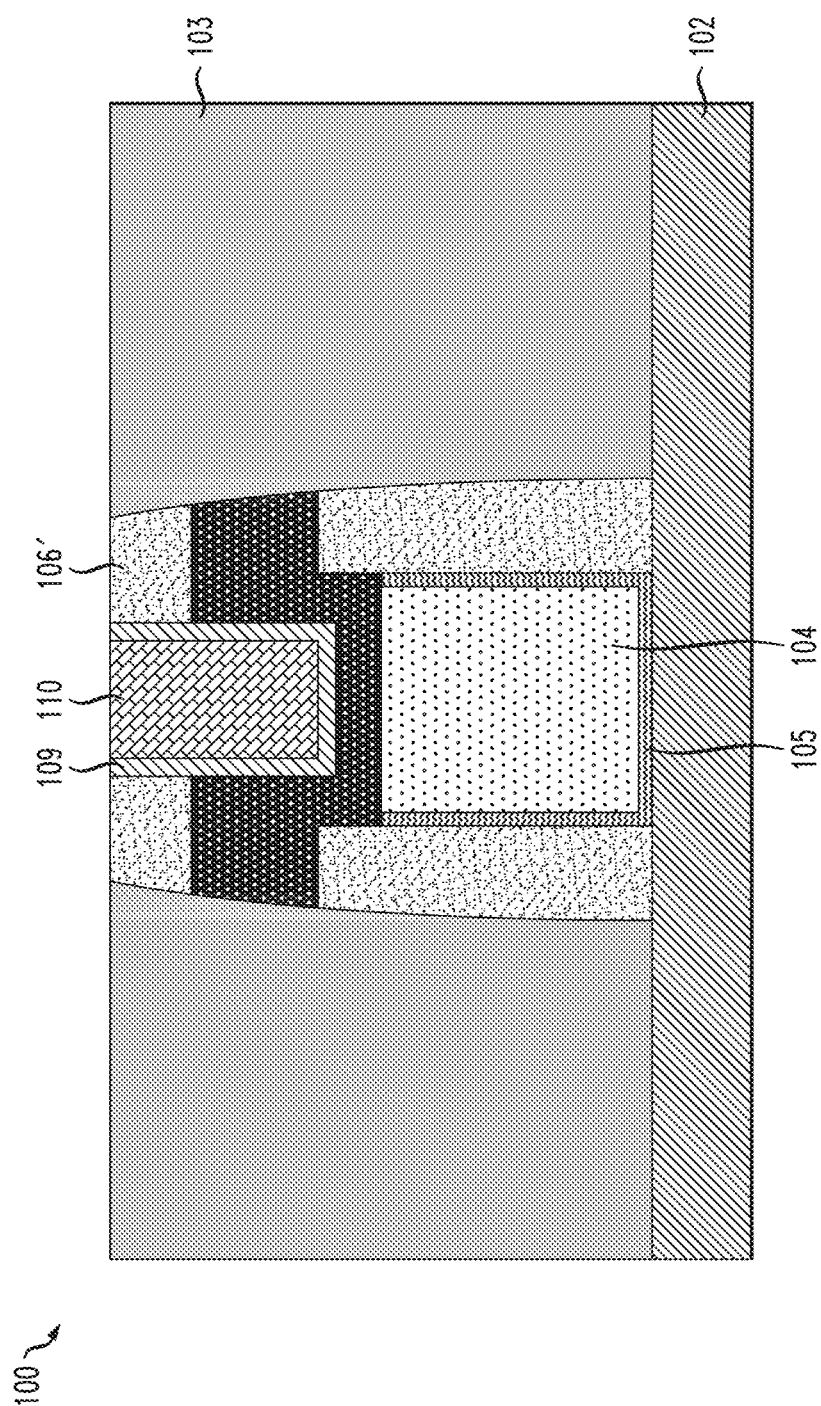
FIG. 10 shows a cross-sectional view of the FIG. 9 structure following deposition of dielectric material on the recessed bottom metal of the MIM capacitor structure, according to an embodiment of the present invention.

Referring to FIG. 10, dielectric cap layers 106' are deposited on the recessed conductive portions 108 and 108' to fill in the vacant areas 113 between the portions of the dielectric layer 109 and portions of the ILD layer 103. As shown by the same pattern and similar numbering, in an embodiment, the dielectric cap layers 106' comprise the same material as the spacers 106. Alternatively, the dielectric cap layers 106' comprise a similar material (e.g., other nitride) to the material of the spacers 106. The dielectric cap layers 106' are deposited using, for example, CVD, PECVD, RFCVD, PVD, ALD, MLD, MBD, PLD, LSMCD, and/or sputtering, which may be followed by planarization by, for example, CMP to remove excess portions of the dielectric cap layer 106' from on top of the ILD layer 103, dielectric layer 109 and/or second conductive layer 110. The CMP process also planarizes the second conductive layer 110 following any loss of the second conductive layer 110 during the selective etching described in connection with FIG. 9.

Figure 11:
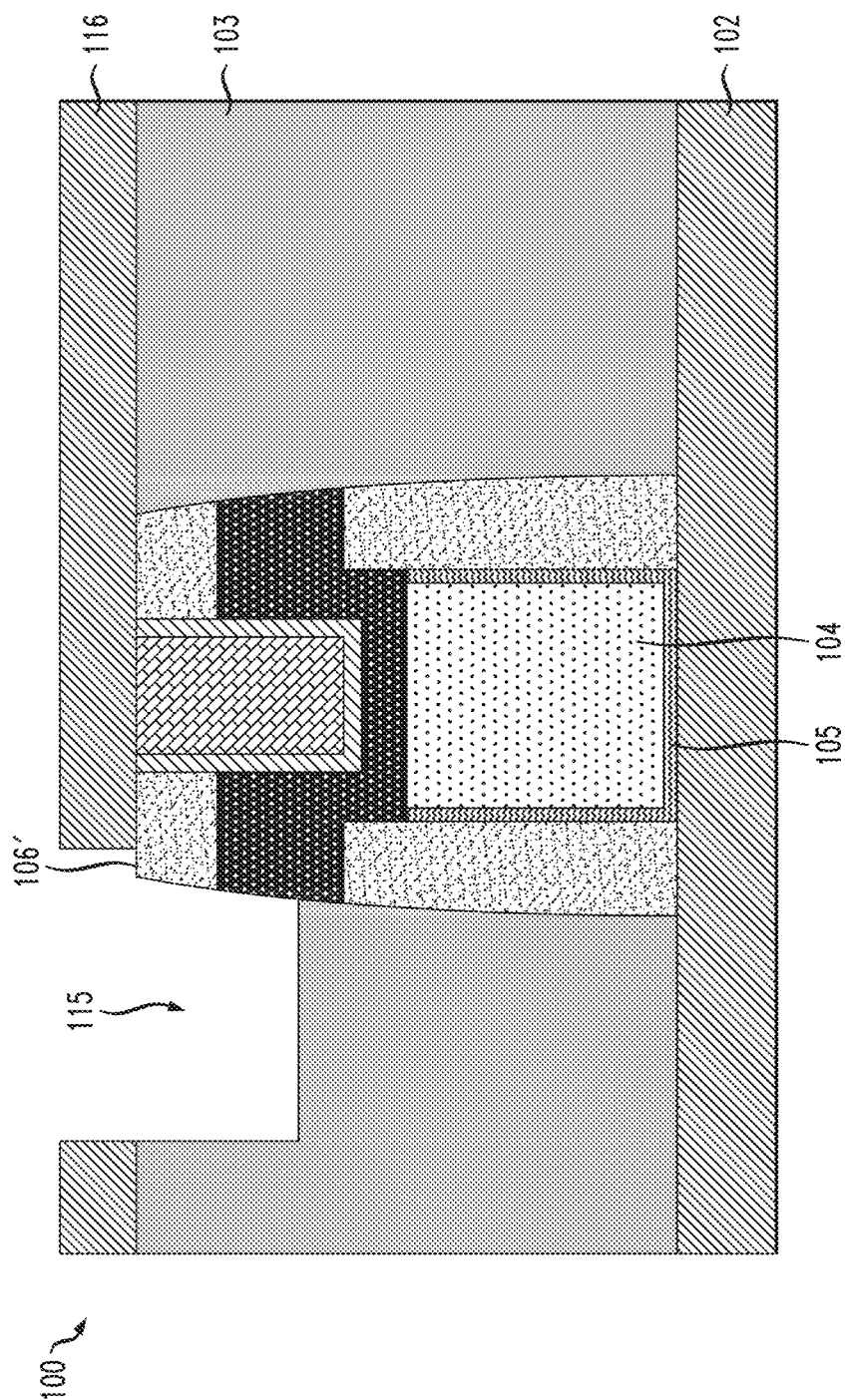
FIG. 11 shows a cross-sectional view of the FIG. 10 structure following deposition of a mask and recessing of a portion of an inter-layer dielectric (ILD) layer, according to an embodiment of the present invention.

Referring to FIG. 11, a mask layer 116 is deposited on portions of the ILD layer 103 and over the gate and capacitor structures. The mask layer 116 comprises, for example, a material the same or similar to that of the spacers 106 and the dielectric cap layers 106' such as, for example SiN or other nitride. The mask layer 116 exposes a portion of the ILD layer 103 on a side of one of the conductive layers 108' and a corresponding dielectric cap layer 106' formed on the one of the conductive layers 108'. The exposed portion of the ILD layer 103 is etched to form a trench 115 in the ILD layer 103. The etching of the exposed portion of the ILD layer 103 can be performed using, for example, a selective reactive ion etching (RIE) process. Portions of the dielectric cap layer 106' that may have been left exposed by the mask 116 remain after etching of the exposed portions of the ILDS layer 103 since the mask layer 116 comprises a same or similar material to that of the dielectric cap layers 106'.

Figure 12:
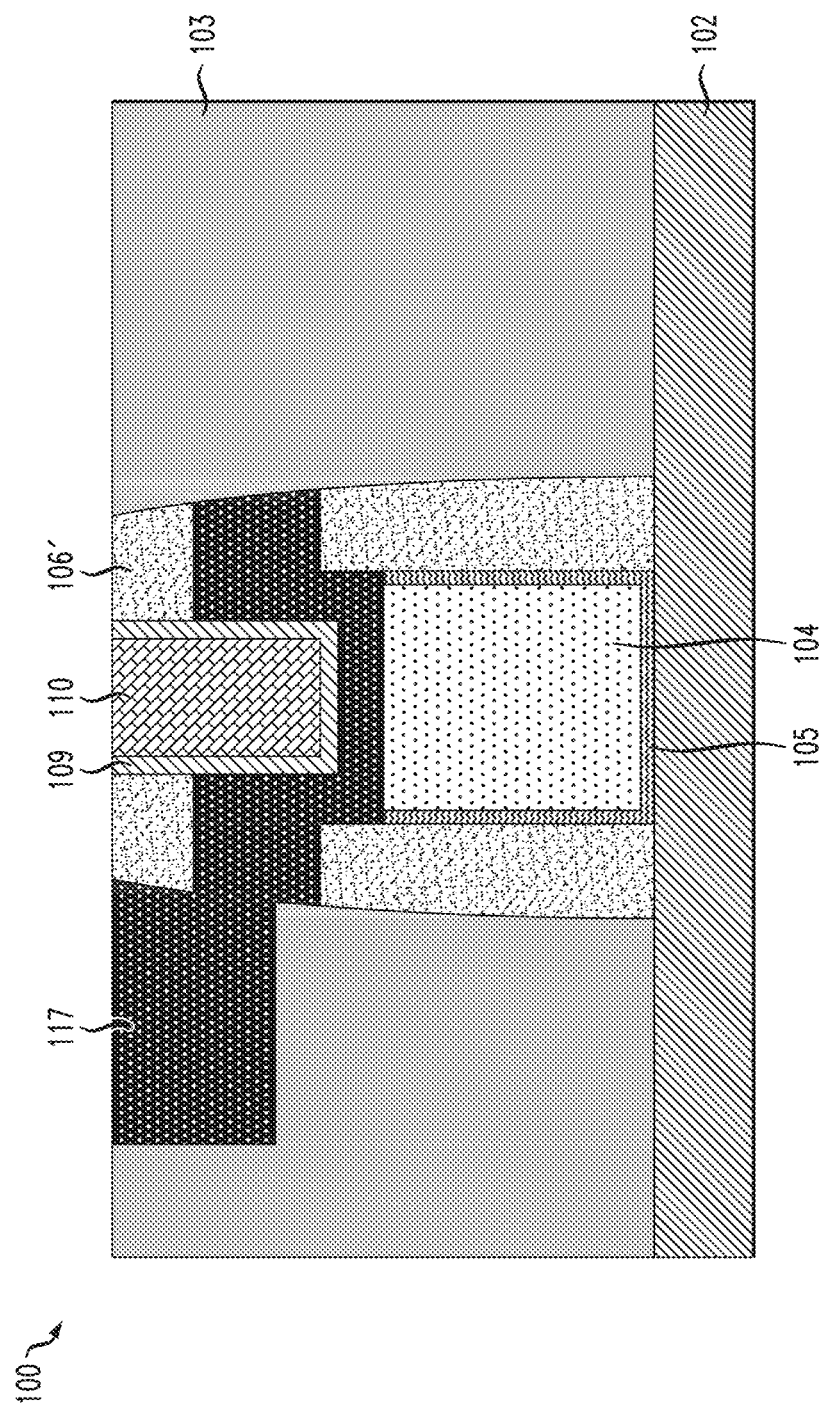
FIG. 12 shows a cross-sectional view of the FIG. 11 structure following mask removal, deposition of metal and planarization, according to an embodiment of the present invention.

Referring to FIG. 12, the mask layer 116 is removed and a conductive layer 117 is deposited to fill in the trench 115. As shown by the same pattern, in an embodiment, the conductive layer 117 comprises the same material as the first conductive layer 108 and the conductive layer 108' and functions to further extend the conductive layer 108. Alternatively, the conductive layer 117 comprises another conductive material, such as another conductive metal. The conductive layer 117 is deposited using, for example, CVD, PECVD, RFCVD, PVD, ALD, MLD, MBD, PLD, LSMCD, and/or sputtering, followed by planarization by, for example, CMP to remove excess portions of the conductive layer 117 from on top of the ILD layer 103, dielectric cap layer 106', dielectric layer 109 and/or second conductive layer 110.

Figure 13:
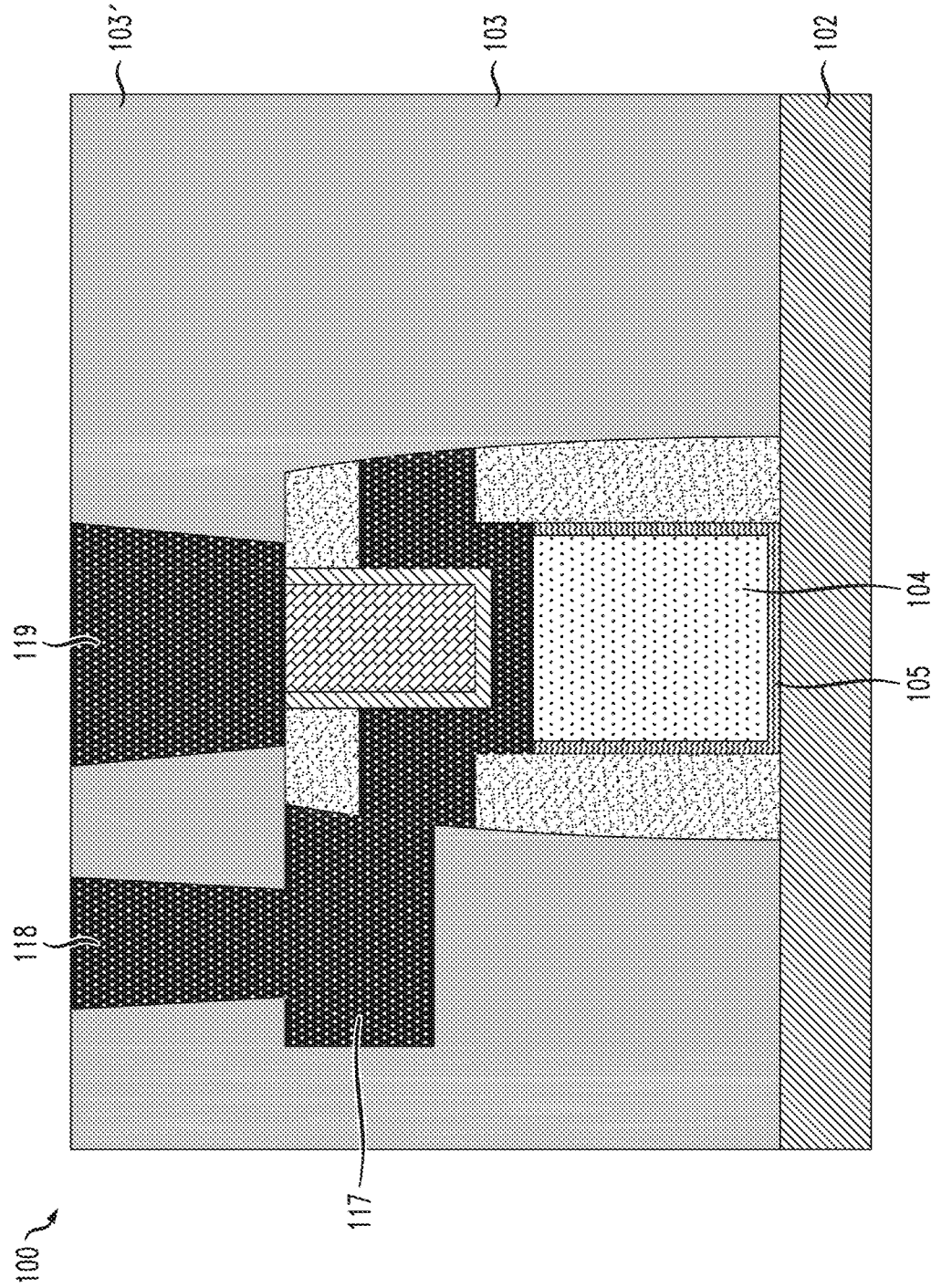
FIG. 13 shows a cross-sectional view of the FIG. 12 structure following deposition of additional ILD material and contact formation, according to an embodiment of the present invention.

Referring to FIG. 13, an upper ILD layer 103' is formed on the structure of FIG. 12. The upper ILD layer 103' includes, the same or a similar material to that of the ILD layer 103. According to an embodiment of the present invention, the upper ILD layer 103' is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Trenches are opened in the upper ILD layer 103' over the dielectric and second conductive layers 109 and 110 of the MIM capacitor structure, and over the conductive layer 117 using, for example, lithography followed by a RIE process. In a non-limiting example, as shown in FIG. 13, a contact 118 to the conductive layer 117 (and ultimately to the lower conductive layer 108 of the MIM capacitor) and a contact 119 to the upper conductive layer 110 of the MIM capacitor formed in respective trenches by filling the trenches with a contact material layer, such as, for example, electrically conductive material including, but not necessarily limited to, tungsten, cobalt, zirconium, tantalum, TaN, titanium, TiN, aluminum, ruthenium, and/or copper. The contact 118 also functions as a contact to the gate conductive portion 104.

Deposition of the contact material layers can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor structure, comprising:
a gate structure of a transistor, the gate structure comprising a gate conductive portion disposed on a gate dielectric layer;
a capacitor structure disposed on the gate structure, the capacitor structure comprising a first conductive layer, a dielectric layer disposed on the first conductive layer and a second conductive layer disposed on the dielectric layer; and
a plurality of spacers disposed on sides of the gate structure;
wherein a portion of the first conductive layer extends on top of at least one of the spacers; and
wherein the first and second conductive layers are respectively connected to a first contact portion and a second contact portion.

2. The semiconductor structure according to claim 1, wherein the first and second conductive layers comprise different materials from each other.

3. The semiconductor structure according to claim 1, further comprising an inter-layer dielectric layer disposed on top of and on the sides of the gate structure and on top of and on sides of the capacitor structure, wherein the second contact portion is formed in the inter-layer dielectric layer on top of the second conductive layer of the capacitor structure.

4. The semiconductor structure according to claim 1, wherein the first conductive layer contacts the gate conductive portion.

5. The semiconductor structure according to claim 1, wherein the plurality of spacers are further disposed on sides of a portion of the capacitor structure.

6. The semiconductor structure according to claim 5, further comprising an inter-layer dielectric layer disposed on top of and on the sides of the gate structure and on top of and on sides of the capacitor structure, wherein the first contact portion is formed in the inter-layer dielectric layer and the portion of the first conductive layer on top of the at least one of the spacers contacts the first contact portion.

7. The semiconductor structure according to claim 5, further comprising a dielectric cap layer disposed on the portion of the first conductive layer on top of the at least one of the spacers.

8. The semiconductor structure according to claim 7, wherein the dielectric cap layer is disposed on a side of an upper portion of the capacitor structure.

9. A semiconductor structure, comprising:
a gate structure of a transistor, the gate structure comprising a gate conductive portion disposed on a gate dielectric layer; and
a capacitor structure disposed on the gate structure, the capacitor structure comprising a first conductive layer, a dielectric layer disposed on the first conductive layer and a second conductive layer disposed on the dielectric layer;
wherein the first and second conductive layers are respectively connected to a first contact portion and a second contact portion; and
wherein the gate and capacitor structures form part of a three transistor, one capacitor circuit.

10. A neuromorphic computing device comprising an array of memory cells, at least one of the memory cells comprising:
a transistor comprising a gate structure; and
a capacitor connected to the gate structure;
wherein the capacitor comprises:
a first conductive layer on top of the gate structure;
a second conductive layer on the first conductive layer; and
a dielectric layer between the first conductive layer and the second conductive layer;

wherein the first and second conductive layers are respectively connected to a first contact and a second contact; and wherein the first conductive layer extends from a side of the capacitor to contact the first contact.

11. The neuromorphic computing device of claim 10, wherein the first and second conductive layers comprise different materials from each other.

12. The neuromorphic computing device of claim 10, wherein the at least one of the memory cells further comprises two additional transistors connected to the capacitor.

13. The neuromorphic computing device of claim 10, wherein the gate structure comprises a gate conductive portion, and wherein the first conductive layer contacts the gate conductive portion.

14. A method of forming a semiconductor structure, comprising:
    forming a gate dielectric layer;
    forming a gate conductive portion on the gate dielectric layer, wherein the gate dielectric layer and the gate conductive portion form part of a field-effect transistor;
    forming a first conductive layer on top of the gate conductive portion;
    forming a dielectric layer on the first conductive layer;
    forming a second conductive layer on the dielectric layer;
    wherein the first and second conductive layers and the dielectric layer form a metal-insulator-metal capacitor;
    forming a first contact portion connected to the first conductive layer; and
    forming a second contact portion connected to the second conductive layer,
    wherein the first conductive layer extends from a side of the metal-insulator-metal capacitor to contact the first contact portion.

15. The method according to claim 14, wherein the first and second conductive layers comprise different materials from each other.

16. The method according to claim 14, further comprising forming a plurality of spacers on sides of the gate dielectric layer and sides of the gate conductive portion.

17. The method according to claim 14, wherein the second contact portion is formed on top of the second conductive layer.

18. The method according to claim 14, wherein the first conductive layer contacts the gate conductive portion.

19. A method of forming semiconductor structure, comprising:
    forming a gate dielectric layer;
    forming a gate conductive portion on the gate dielectric layer, wherein the gate dielectric layer and the gate conductive portion form part of a field-effect transistor;
    forming a first conductive layer on top of the gate conductive portion;
    forming a dielectric layer on the first conductive layer;
    forming a second conductive layer on the dielectric layer;
    wherein the first and second conductive layers and the dielectric layer form a metal-insulator-metal capacitor;
    forming a first contact portion connected to the first conductive layer;
    forming a second contact portion connected to the second conductive layer; and
    forming a plurality of spacers on sides of the gate dielectric layer and sides of the gate conductive portion;
    wherein a portion of the first conductive layer extends on top of at least one of the spacers.

20. The method according to claim 19, further comprising forming a dielectric cap layer on the portion of the first conductive layer on top of the at least one of the spacers.

* * * * *